US008863071B2

(12) United States Patent
Chan et al.

(10) Patent No.: US 8,863,071 B2
(45) Date of Patent: Oct. 14, 2014

(54) DE-POP ON-DEVICE DECOUPLING FOR BGA

(75) Inventors: Alex Chan, Nepean (CA); Paul James Brown, Ottawa (CA)

(73) Assignee: Alcatel Lucent, Boulogne-Billancourt (FR)

( * ) Notice: Subject to any disclaimer, the term of this patent is extended or adjusted under 35 U.S.C. 154(b) by 367 days.

(21) Appl. No.: 13/231,609

(22) Filed: Sep. 13, 2011

(65) Prior Publication Data

US 2013/0062763 A1    Mar. 14, 2013

(51) Int. Cl.
*G06F 17/50* (2006.01)
*H01L 23/498* (2006.01)
*H01L 23/50* (2006.01)

(52) U.S. Cl.
CPC . *H01L 23/49816* (2013.01); *H01L 2224/73204* (2013.01); *H01L 23/50* (2013.01)
USPC ......................................................... 716/137

(58) Field of Classification Search
USPC ......................................................... 716/137
See application file for complete search history.

(56) References Cited

U.S. PATENT DOCUMENTS

| 7,323,787 | B2 | 1/2008 | Chan et al. | |
|---|---|---|---|---|
| 7,602,615 | B2 | 10/2009 | Chan et al. | |
| 7,738,259 | B2 | 6/2010 | Chan et al. | |
| 2002/0011859 | A1* | 1/2002 | Smith et al. | 324/755 |
| 2002/0054467 | A1* | 5/2002 | Tsai et al. | 361/302 |
| 2005/0162839 | A1* | 7/2005 | Chan et al. | 361/782 |
| 2009/0175012 | A1* | 7/2009 | Frasco | 361/762 |

OTHER PUBLICATIONS

Unpublished U.S. Appl. No. 12/984,240.

* cited by examiner

*Primary Examiner* — Vuthe Siek
*Assistant Examiner* — Mohammed Alam
(74) *Attorney, Agent, or Firm* — Kramer & Amado, P.C.

(57) ABSTRACT

Embodiments of the invention place surface-mount devices such as decoupling capacitors, resistors or other devices directly on the underside of a ball grid array (BGA) electronic integrated circuit (EIC) package, in place of de-populated BGA pads.

14 Claims, 3 Drawing Sheets

US 8,863,071 B2

DE-POP ON-DEVICE DECOUPLING FOR BGA

CROSS REFERENCE TO RELATED APPLICATIONS

The present application is related to co-pending U.S. patent application entitled "IN-GRID ON-DEVICE DECOUPLING FOR BGA" (Chan et al.), filed concurrently herewith, the entire content of which is incorporated herein by reference.

FIELD OF THE INVENTION

The invention is directed to Ball Grid Array (BGA) packages for use on electronic circuit cards and more specifically, improved decoupling arrangements.

BACKGROUND OF THE INVENTION

As electronic integrated circuit (EIC) packages such as Ball Grid Array (BGA) packages increase in density, in interface connection density, and in clock speed, the requirements for electrically decoupling a BGA device become more stringent. It is advantageous to place these coupling capacitors as close to the BGA pads as possible. Typical placement of surface-mount decoupling capacitors is adjacent to the BGA device on the same side of the electronic circuit board (printed circuit board or PCB) or on the opposite side of the electronic circuit board, connected by vias through the circuit board. Both of these techniques can introduce parasitic inductance due to the length of the vias and/or the routing leads.

Therefore, improvement to decoupling techniques for BGA devices is highly desirable.

SUMMARY OF THE INVENTION

Embodiments of the invention place surface-mount devices such as decoupling capacitors, resistors or other devices directly on the underside of a ball grid array (BGA) electronic integrated circuit (EIC) package, in place of de-populated BGA pads.

Some embodiments of the invention provide an electronic integrated circuit (EIC) package comprising: an EIC substrate; an array of ball grid array (BGA) pads on a first side of the EIC substrate, arranged in a grid pattern of rows and columns; and contact pads on the first side of the EIC substrate to accommodate electrical connection of a surface-mount device, wherein the surface-mount device occupies a grid location of the grid pattern in place of one or more BGA pads.

In some embodiments the contact pads comprise at least two adjacent contact pads.

In some embodiments the contact pad is connected to an adjacent BGA pad by a conductor on the first side of the EIC substrate.

In some embodiments the surface-mount device comprises a two-port device.

In some embodiments the surface-mount device comprises a decoupling capacitor.

In some embodiments the surface-mount device is selected from the set of: capacitor, resistor, inductor, diode, transistor, capacitor array, and resistor-capacitor circuit.

In some embodiments the BGA grid comprises a pitch of between about 0.4 mm×0.4 mm and about 1.27 mm×1.27 mm.

In some embodiments the BGA grid comprises an irregular pitch.

Other embodiments of the invention provide a computer-aided design tool for accommodating a surface-mount device on a first surface of a ball grid array (BGA) electronic integrated circuit (EIC) package, the tool comprising: a design tool mode to identify, in an EIC configuration of BGA pads in a grid pattern on the first side of the EIC package, at least two contact pads for forming directly on the first surface, the contact pads for direct mounting of and connection to the surface-mount device, wherein the surface-mount device occupies a grid location of the grid pattern in place of one or more BGA pads.

BRIEF DESCRIPTION OF THE DRAWINGS

Some embodiments of apparatus and/or methods in accordance with embodiments of the present invention are now described, by way of example only, and with reference to the accompanying drawings in which.

In the figures, like features are denoted by like reference characters.

DETAILED DESCRIPTION

Figure 1:
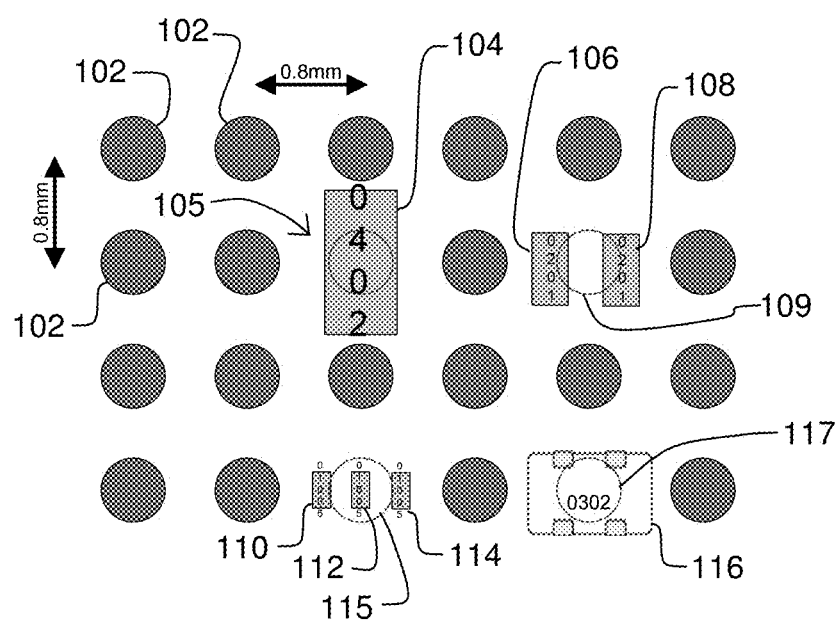
FIG. 1 illustrates a layout of surface mount devices within a BGA grid according to embodiments of the invention

FIG. 1 illustrates a bottom surface layout of an electronic integrated circuit (EIC) package having BGA pads 102 arranged in a BGA grid pitch of 0.80 mm×0.80 mm. Certain BGA pads (105, 109, 115, 117) are de-populated and the resulting free space is used for placing surface-mount decoupling capacitors 104, 106, 108, 110, 112, 114, and 116. By depopulating BGA pad 105, there is room to mount a '0402' package surface-mount capacitor 104. In a similar manner, BGA pad 109 is de-populated to provide room for two '0201' package surface-mount capacitors 106, 108. BGA pad 115 is de-populated to provide room for three '01005' package surface-mount capacitors 110, 112, 114. BGA pad 117 is de-populated to provide room for capacitor array 116 in a standard '0302' surface-mount package (0.030"×0.020"). The surface-mount devices can be placed in a variety of orientations including longitudinally, laterally or diagonally with respect to the BGA grid.

Figure 2:
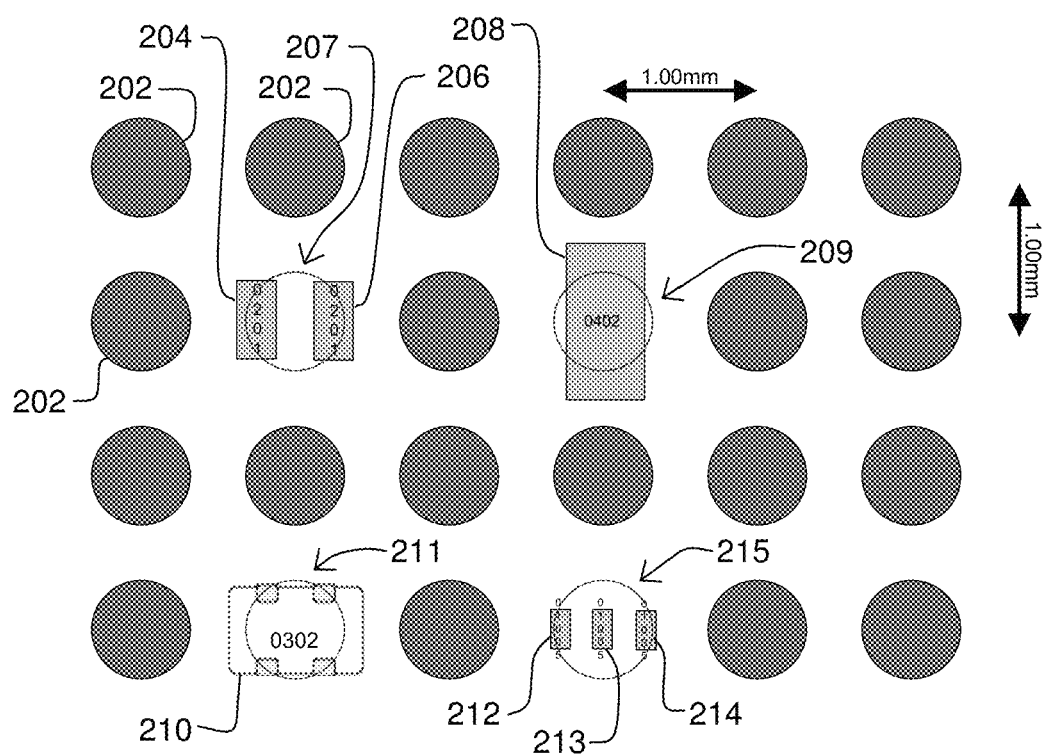
FIG. 2 illustrates a layout of surface mount devices within a BGA grid on an EIC substrate according to other embodiments of the invention.

FIG. 2 illustrates a bottom surface layout of an electronic integrated circuit (EIC) package having BGA pads 202 arranged in a BGA grid pitch of 1.00 mm×1.00 mm. BGA pad 207 is de-populated and the resulting free space is used for placing two '0201' package surface-mount decoupling capacitors 204, 206. BGA pad 209 is similarly de-populated and the resulting free space is used for placing a '0402' package surface-mount decoupling capacitor 209. BGA pad 211 is de-populated to provide room for capacitor array 210 in a standard '0302' surface-mount package and BGA pad 215 is de-populated to provide room for placing three '01005' package surface-mount decoupling capacitors 212, 213, and 214.

Many BGA EIC packages do not use the full array of BGA pads which can provide the flexibility to use the space for surface-mount components. This can be especially advantageous for devices such as decoupling capacitors which benefit from mounting in close proximity to BGA pads for voltage supply connections and ground connections on BGA EIC packages to minimize parasitic inductance. As the trend toward using BGA grid patterns with smaller pitches continues, such as 1.27 mm×1.27 mm, 1.0 mm×1.0 mm, 0.8 mm×0.8 mm, and 0.5 mm×0.5 mm there is less space available between BGA pads in a full BGA grid pattern for mounting surface-mount components such as standard '0402' surface-mount package (0.04"×0.02"), '0201' package (0.020"×0.010") or '01005' package (0.010"×0.005"). Embodiments of this invention advantageously provide for locating surface mount components in place of BGA pads at ball grid array locations. Embodiments of the invention are suited as well for BGA packages having an irregular pitch where longitudinal rows have a different pitch than lateral rows such as for example 0.8 mm×1.0 mm Other embodiments contemplated by this invention include depopulating a plurality of BGA pads on a BGA EIC package in order to accommodate surface-mount devices between the remaining BGA pads.

Additional embodiments of this invention contemplate the use of surface-mount devices including two-port devices such as capacitors, resistors, diodes, inductors, etc. as well as multi-port devices such as capacitor arrays, resistor-capacitor combinations, as well as active devices such as transistors.

Figure 3A:
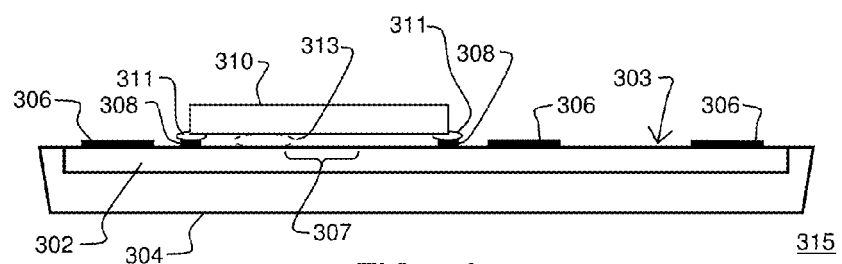
FIG. 3A illustrates placement of surface mount devices on an EIC substrate according to an embodiment of the invention.
Figure 3B:
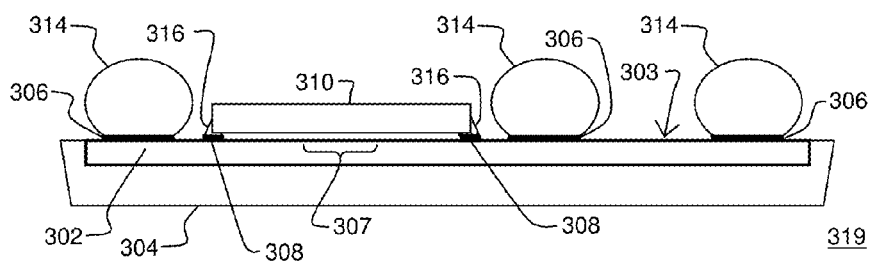
FIG. 3B illustrates placement of surface mount devices between BGA solder balls on an EIC substrate according to an embodiment of the invention.
Figure 3C:
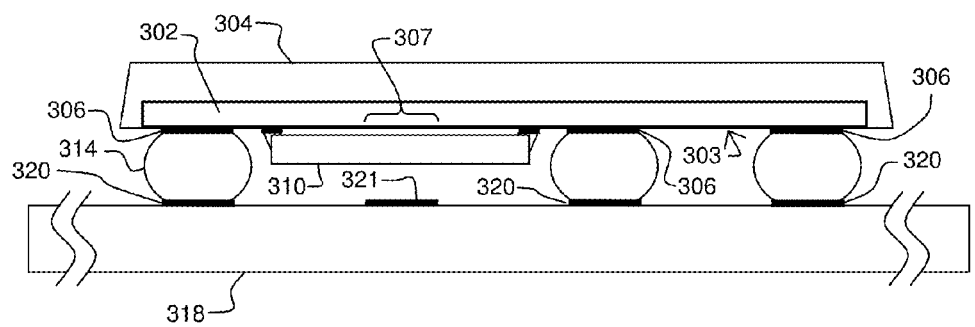
FIG. 3C illustrates placement of an EIC device on a printed circuit board according to an embodiment of the invention.

FIGS. 3A, 3B, 3C illustrate placement of surface-mount devices on an EIC substrate 302 relative to BGA solder spheres 314 and an electronic printed circuit board 318. The EIC has a substrate 302 and cover or overmold 304 to protect the integrated circuit. On a first surface 303 of substrate 302, are BGA pads 306 arranged in a grid pattern. BGA pad 307 is de-populated, that is, if the BGA grid pattern were full, there would be a BGA pad at location 307. By not populating BGA pad 307, there is space to accommodate surface-mount device 310. Contact pads 308 can be connected to adjacent BGA pads 306 to minimize connection distance between device 310 and the circuitry of BGA EIC 302 as discussed previously.

During assembly, surface-mount component 310 is placed on surface-mount pads 308 which have been previously prepared with solder paste 311. Surface-mount device 310 can be held in position with the tacky solder paste 311 on the surface mount pads and optionally by adhesive 313 between the body of device 310 and the surface 303. Additional surface mount devices are handled similarly to device 310. BGA solder balls (spheres) 314 are applied onto BGA pads 306. The balls 314 can be held in place by tacky flux as is well known in the art. The EIC package assembly 315 with surface mount devices 310, 312 and solder balls 314 is then reflow-soldered to form an electrical and mechanical bond between surface-mount device 310 and pads 308 and between BGA solder balls 314 and BGA pads 306. Solder paste 311 reflows to form solder fillets 316.

EIC package assembly 319 with solder balls 314 and with surface-mount device 310 can then be operationally tested as a unit to verify operation of the EIC in conjunction with device 310. Devices 310, 312 and solder fillets 316, 317 can also be easily visually inspected at this stage. Advantageously, it is easier to address any problems with the surface-mount components 310, 312 then after the EIC is mounted on a printed circuit board. These steps can be performed by the manufacturer of the EIC assembly prior to delivery to a customer who would mount the EIC assembly on an electronic printed circuit board.

With reference to FIG. 3C, assembly 319 can then be mounted on printed circuit board 318 and reflow soldered to bond solder balls 314 to BGA solder pads 320. Note that it is possible to mount EIC package assembly 319 with surface-mount component 310 over top of unused BGA pad 321 on printed circuit board 318. In this manner, EIC package designs having unused BGA pads (no connection) could be redesigned to accommodate surface-mount devices occupying the location of an unused BGA pad 307. Such a modified design could be used with a printed circuit board where the corresponding no-connection BGA pad 321 is still present. Otherwise, future EIC packages can be designed to optimize the location of decoupling capacitors between voltage source connections and ground connections and printed circuit boards can be designed accordingly.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

It should be appreciated by those skilled in the art that any block diagrams herein represent conceptual views of illustrative circuitry embodying the principles of the invention. Numerous modifications, variations and adaptations may be made to the embodiment of the invention described above without departing from the scope of the invention, which is defined in the claims.

What is claimed is:

1. An electronic integrated circuit (EIC) package comprising:
    an EIC substrate;
    an array of ball grid array (BGA) pads on a first side of said EIC substrate, arranged in a grid pattern of rows and columns; and
    contact pads on said first side of said EIC substrate between said BGA pads to accommodate electrical connection of a surface-mount device, wherein said surface-mount device occupies a single grid location of said grid pattern in place of one of the BGA pads wherein said surface-mount device is selected from the set of: capacitor, resistor, inductor, diode, transistor, capacitor array, and resistor-capacitor circuit.

2. The EIC package of claim 1, wherein said contact pads comprise at least two adjacent contact pads.

3. The EIC package of claim 2, wherein each said contact pad is connected to an adjacent BGA pad by a conductor on said first side of said EIC substrate.

4. The EIC package of claim 1, wherein said surface-mount device comprises a two-port device.

5. The EIC package of claim 4, wherein said surface-mount device comprises a decoupling capacitor.

6. The EIC package of claim 1, wherein said BGA grid comprises a pitch of between about 0.8 mm×0.8 mm and about 1.27 mm×1.27 mm.

7. The EIC package of claim 6, wherein said BGA grid comprises an irregular pitch.

8. A computer-aided design tool for accommodating a surface-mount device on a first side of a ball grid array (BGA) electronic integrated circuit (EIC) package, said computer-aided design tool comprising:

a device configured to identify, in an EIC configuration of BGA pads in a grid pattern on said first side of said EIC package, at least two contact pads for forming directly on said first side and between said BGA pads, said contact pads for direct mounting of and connection to said surface-mount device, wherein said surface-mount device occupies a single grid location of said grid pattern in place of one of the BGA pads wherein said surface-mount device is selected from the set of: capacitor, resistor, inductor, diode, transistor, capacitor array, and resistor-capacitor circuit.

9. The computer-aided design tool of claim 8, wherein each said contact pad is connected to an adjacent BGA pad by a conductor on said first side of said EIC package.

10. The computer-aided design tool of claim 8, wherein said surface-mount device comprises a two-port device.

11. The computer-aided design tool of claim 8, wherein said surface-mount device comprises a decoupling capacitor.

12. The computer-aided design tool of claim 8, wherein said surface-mount device is selected from a set of a capacitor, a resistor, an inductor, a diode, a transistor, a capacitor array, and a resistor-capacitor circuit.

13. The computer-aided design tool of claim 8, wherein said BGA grid comprises a pitch of between about 0.8 mm×0.8 mm and about 1.27 mm×1.27 mm.

14. The computer-aided design tool of claim 13, wherein said BGA grid comprises an irregular pitch.

\* \* \* \* \*